United States Patent [19]

Seong et al.

[11] Patent Number: 5,383,797
[45] Date of Patent: Jan. 24, 1995

[54] SYSTEM FOR HANDLING ELECTRICAL CONNECTORS BY A VACUUM-SUCTION NOZZLE

[75] Inventors: AuYong C. Seong; Yuen P. Wong; Lai M. Sang, all of Singapore, Singapore

[73] Assignee: Molex Incorporated, Lisle, Ill.

[21] Appl. No.: 89,946

[22] Filed: Jul. 8, 1993

[51] Int. Cl.6 .............................................. H01R 13/00
[52] U.S. Cl. ...................................... 439/476; 439/135
[58] Field of Search ............... 439/83, 135, 476, 476.1, 439/856, 857

[56] References Cited

U.S. PATENT DOCUMENTS

| | | |
|---|---|---|
| 3,525,143 | 8/1970 | Devito . |
| 4,645,278 | 2/1987 | Yevak, Jr. et al. ............. 439/135 X |
| 4,910,867 | 3/1990 | Weigert ................................. 29/839 |
| 5,055,971 | 10/1991 | Fudala et al. ...................... 361/400 |
| 5,147,209 | 9/1992 | Litwin et al. ..................... 439/476.1 |
| 5,249,977 | 10/1993 | Tanaka et al. .................... 439/476.1 |
| 5,277,601 | 1/1994 | Miyazawa ........................ 439/476.1 |

OTHER PUBLICATIONS

SAMTEC's Surface Mount Interconnect Handbook, pp. 19+20 Dated 1992.

Primary Examiner—Khiem Nguyen
Attorney, Agent, or Firm—Charles S. Cohen

[57] ABSTRACT

A system is provided for mounting a connector assembly to a mounting surface of an electrical apparatus through the use of a vacuum-suction nozzle. The connector assembly includes a dielectric housing adapted to be positioned adjacent the mounting surface. The housing has a plurality of terminal-receiving through passages. A plurality of electrical terminals are mounted in the passages and include tail portions projecting from first open ends of the through passages for interconnection to circuitry of the electrical apparatus. A film is secured to the housing covering second open ends of at least some of the through passages to provide a smooth surface area for engagement by the vacuum-suction nozzle for manipulating and positioning the connector assembly. Preferably, the film has an adhesive on one side thereof for securing to the housing.

7 Claims, 2 Drawing Sheets

SYSTEM FOR HANDLING ELECTRICAL CONNECTORS BY A VACUUM-SUCTION NOZZLE

FIELD OF THE INVENTION

This invention generally relates to the art of electrical connectors and, particularly, to a system for manipulating and positioning a connector assembly through the use of a vacuum-suction nozzle.

BACKGROUND OF THE INVENTION

With the continuing trend toward compact electronic apparatus, there is an ever-increasing demand for miniaturized interconnection systems between the electronic components of the apparatus. An example is in computer apparatus wherein there is a constant demand to reduce the thickness or height parameters of the electronic components. With the components mounted on a printed circuit board, the thickness or height parameters relate to the distance above the board in which desired interconnections are made and which constantly are being miniaturized.

One approach to such miniaturization is to eliminate bulky electrical connector housings and, instead, to use relatively thin connectors or connector blocks for locating and/or terminating tail portions of terminals relative to circuit traces on the printed circuit board. The tails may be soldered to circuit traces on the board or in the holes, and a complementary connector assembly may be mounted directly to the connector block or interconnected thereto by terminal pins extending through the holes in the printed circuit board from the opposite side of the board.

Problems continue to be encountered in handling such connector assemblies for mounting to a mounting surface of an electrical apparatus, such as positioning the connector assembly on the printed circuit board. As is known, a solder reflow process often is used to secure electrical connectors to printed circuit boards. It has become expedient to use a vacuum-suction nozzle for handling the electrical connector to position the connector on the circuit board prior to the solder reflow process. Specifically, an electrical connector is secured by a vacuum-suction nozzle, and the electrical connector is manipulated in position and brought to a selected position on the printed circuit board by the vacuum-suction nozzle. The connector then is released by the nozzle by stopping application of negative pressure thereto. Gas then is released inside the soldering reflow vessel, or infrared rays are radiated therein until the solder applied to selected conductors on the printed circuit board has been melted, thereby soldering the selected conductors to solder tails of the electrical connector.

Such a system involving the use of a vacuum-suction nozzle is quite effective if the electrical connector has a smooth or flat top surface for securement by the vacuum-suction nozzle, as described above. However, connector assemblies often have top surfaces taken up substantially by closely spaced open ends of terminal-receiving passages through the connector housing and, therefore, there is no smooth surface for direct engagement by the vacuum-suction nozzle. An example of such a connector assembly is where open-ended or through passages are formed in the housing with terminal receptacles top-loaded into the passages. During mating, terminal pins of a complementary electrical connector extend through the printed circuit board and into the bottom of the passages containing the terminal receptacles. With such connector assemblies, there is no smooth surface for engagement by the vacuum-suction nozzle.

Consequently, it has been proposed to employ a separate cover which presents a smooth top surface for engagement by the vacuum-suction nozzle, the cover being releasably interengaged with the terminals of the connector assembly. After the connector assembly is brought to a selected position on the printed circuit board by the vacuum-suction nozzle, and after the solder reflow process, the separate cover is removed and the connector assembly is left interconnected to the printed circuit board by the soldering of the terminal tails to the selected circuit traces on the printed circuit board.

The present invention is directed to an improved system of the character described, by employing a simple adhesive-backed film adhered to the top surface of a connector assembly covering the top ends of the terminal-receiving passages therein, and presenting a smooth surface for engagement by a vacuum-suction nozzle.

SUMMARY OF THE INVENTION

An object, therefore, of the invention is to provide a new and improved system for positioning or mounting a connector assembly on a mounting surface of an electrical apparatus, such as a printed circuit board, through the use of a vacuum-suction nozzle.

In the exemplary embodiment of the invention, a connector assembly is provided with a dielectric housing adapted to be positioned adjacent the mounting surface of the electrical apparatus, such as mounting to a surface of the printed circuit board. The housing has a plurality of terminal-receiving through passages. A plurality of electrical terminals are mounted in the passages and include tail portions projecting from first open ends of the through passages for interconnection to circuitry of the electrical apparatus, such as circuit traces on the printed circuit board. A film is secured to the housing covering opposite open ends of the through passages to provide a smooth surface area for engagement by the vacuum-suction nozzle for manipulating and positioning the connector assembly.

In the preferred embodiment of the invention, the film has an adhesive on one side thereof for securing to the housing. The dielectric housing has a top surface and a bottom surface with the through passages extending therebetween. The film is adhered to the top surface. The bottom surface is adapted for mounting to a surface of a printed circuit board. The tail portions of the terminals comprise solder tails for soldering to circuit traces on the circuit board.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
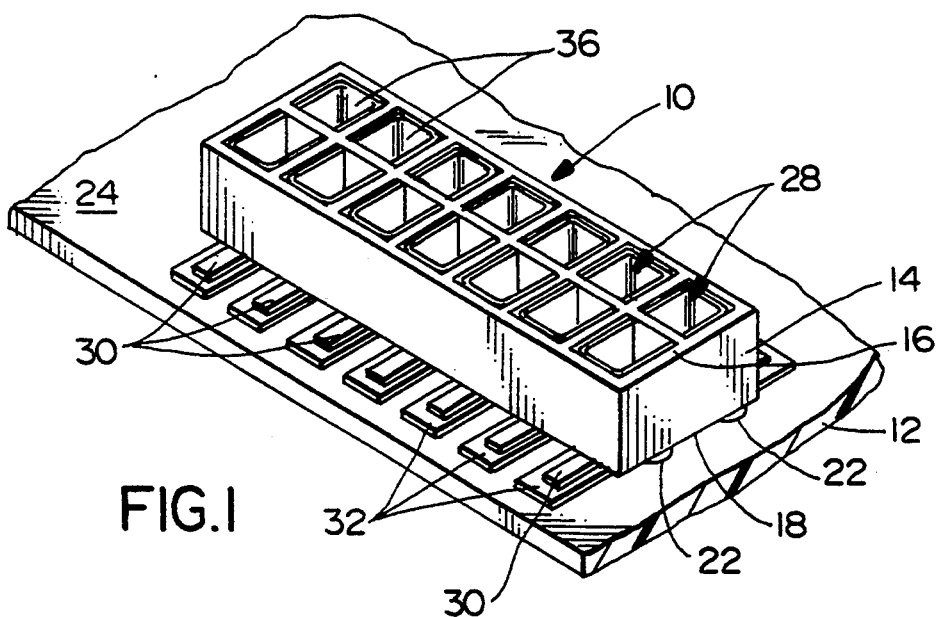
FIG. 1 is a perspective view of a connector assembly according to the invention, surface mounted to a printed circuit board, and with the film removed to facilitate the illustration of the open passages and top-loaded terminals.

Referring to the drawings in greater detail, the invention is directed to a system for mounting a connector assembly, such as a connector assembly generally designated 10, to a mounting surface of an electrical apparatus, such as a printed circuit board 12, through the use of a vacuum-suction nozzle as described in the "Background" above.

Figure 2:
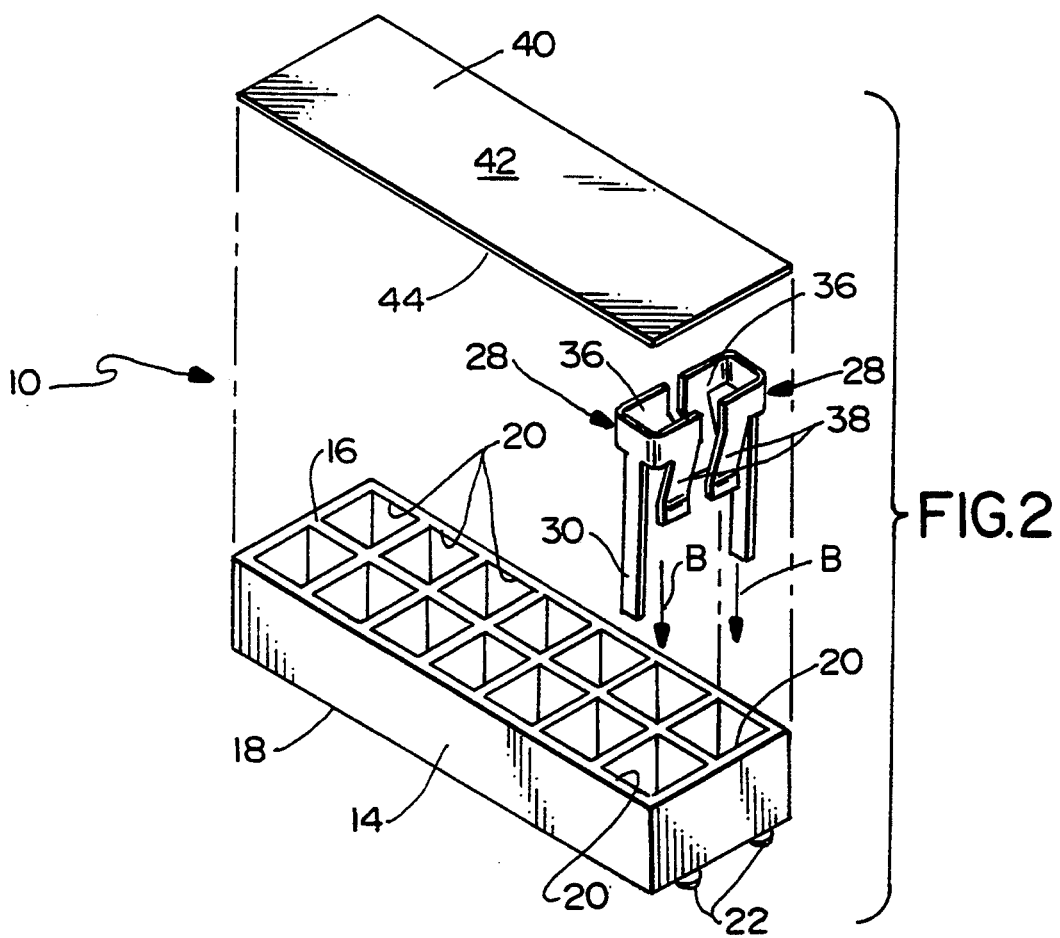
FIG. 2 is an exploded perspective view of the connector assembly, including the housing, a pair of the terminals and the film.
Figure 3:
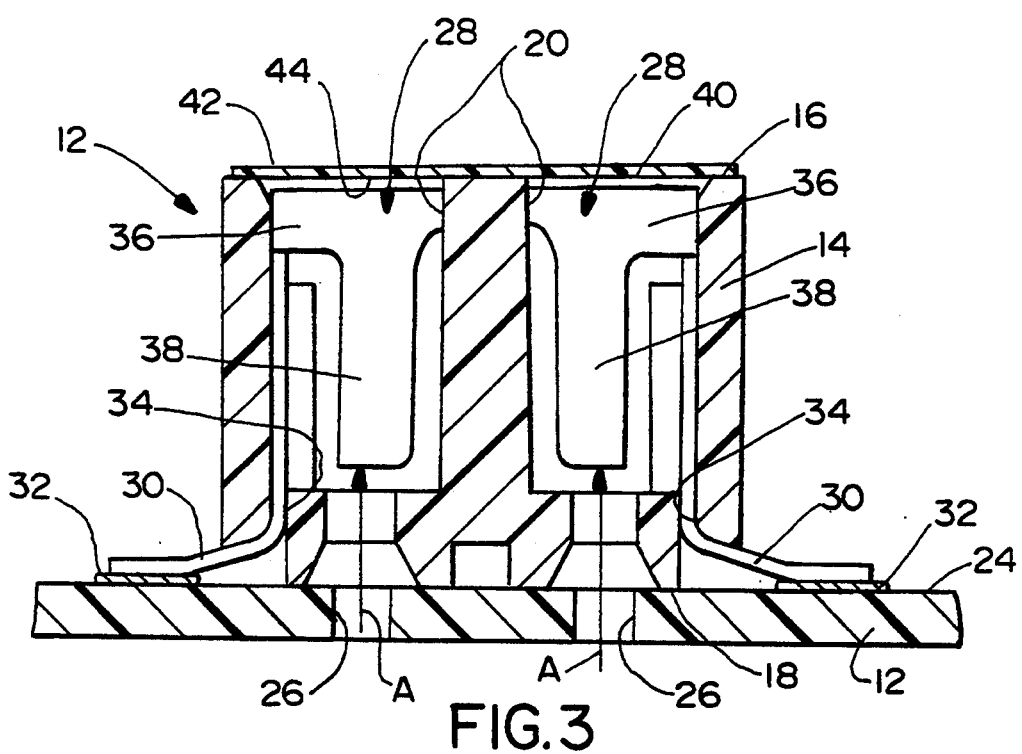
FIG. 3 is a vertical section, on an enlarged scale, transversely through the connector assembly mounted to the printed circuit board.

Connector assembly 10 includes a dielectric housing block 14 of a conventional rectangular configuration and defining a top surface 16 and a bottom surface 18. A plurality of open-ended, terminal-receiving passages 20 (FIG. 2) extend between the top and bottom surfaces of the housing. A plurality of mounting pegs 22 depend from the bottom surface of the housing whereby the connector assembly is adapted for mounting the bottom surface adjacent a top or mounting surface 24 of printed circuit board 12. As seen in FIG. 3, the printed circuit board has a plurality of holes 26 in alignment or registry with the through passages in the connector assembly.

A plurality of electrical terminals, generally designated 28, are mounted in passages 22 of housing 14 and include tail portions 30 projecting from the bottom open ends of the through passages for interconnection to circuitry on the printed circuit board, particularly to circuit traces or pads 32 on top surface 24 of the board. Actually, as seen in FIG. 3, tail portions 30 of terminals 28 project through small passageways 34 of housing 14, the passageways being considered part of the through passages 20. Terminals 28 also include receptacle portions 36 located within passages 20. In the alternative, tails 30 could extend downward into holes in the board for soldering thereto.

Each terminal 28 includes a pair of inwardly biased cantilevered contact arms 38 which are effective for making electrical interengagement with terminal pins of a complementary connector from the opposite or bottom side of printed circuit board 12. The terminal pins of the complementary connector would be inserted in the direction of arrows "A" (FIG. 3) through holes 26 in the printed circuit board and into passages 20 of housing 14 whereupon the terminal pins will interengage with spring contact arms 38 of terminal receptacle portions 36. The terminals are top-loaded into respective ones of passages 20 in housing 14 in the direction of arrows "B" (FIG. 2). Once the terminals are top-loaded into the passages, tail portions 30 are bent transversely outwardly as shown in FIG. 3, whereupon the tail portions can be surface soldered to circuit traces 32 on top surface 24 of the printed circuit board.

At this point, it should be understood that such terms as "top", "bottom", etc. are used herein and in the claims hereof for reference purposes only in order to provide a clear and concise understanding of the invention. Such terms are not to be limiting, because, as is well known in the art, electrical connector assemblies such as connector assembly 10 are used in omni-directional applications.

The invention contemplates an improved system for facilitating manipulating and positioning connector assembly 10 through the use of a vacuum-suction nozzle. To that end, a thin film 40 is secured to top surface 16 of housing 14 for covering the open ends of passages 20 in the top surface. The film provides a smooth top surface area 42 (FIG. 2) for engagement by the vacuum-suction nozzle for manipulating and positioning the connector assembly. Preferably, the film has an adhesive on its bottom surface 44 (FIG. 3) for securing the film to the connector block.

Although the entire top surface 16 of housing 14 is shown herein as being covered by film 42, it should be understood that the film need not cover the entire surface as long as there is a smooth top surface area of a size sufficient for engagement by a particular size of vacuum-suction nozzle. In assembly, terminals 28 are top loaded into passages 20 in the housing, and the adhesive-backed film then is adhered to the top surface of the housing, covering the top open ends of the passages in at least an area sufficient for engagement by the vacuum-suction nozzle.

With film 42 in place, the terminal pins of a complementary connector may only be mated to the terminals 28 of connector assembly 10 from the bottom. However, if a top mating connector is desired, such film may be removed after the soldering process.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A system for mounting a connector assembly to a mounting surface of an electrical apparatus through the use of a vacuum-suction nozzle, comprising:

a connector assembly including a dielectric housing adapted to be positioned adjacent said mounting surface, the housing having a top surface and a bottom surface with a plurality of terminal-receiving through passages extending therebetween, the bottom surface being adapted to be mounted adjacent to the mounting surface of the electrical apparatus, and a plurality of sidewalls extending between said top surface and said bottom surface and defining an outer periphery of said top surface, a plurality of electrical terminals mounted in the passages and including solder tail portions projecting from first open ends of the through passages for solder interconnection to circuitry of the electrical apparatus, and a generally planar film secured directly to the top surface of the housing and covering second open ends of at least some of the through passages to provide a smooth surface area for engagement by the vacuum-suction nozzle for manipulating and positioning the connector assembly, said film being secured only within the outer periphery of said top surface.

2. The system of claim 1 wherein said film has an adhesive on one side thereof for securing to the housing.

3. A system for mounting a connector assembly to a printed circuit board through the use of a vacuum-suction nozzle, comprising:

a dielectric housing having a top surface and a bottom surface with a plurality of open-ended passages extending therebetween, the bottom surface being adapted for mounting adjacent to a printed circuit board having holes with which the passages in the housing are registered;

a plurality of electrical terminals having receptacle portions mounted in the passages and solder tail portions projecting from the open ends of the passages in the bottom surface of the housing for soldering to circuit traces on the printed circuit board; and a generally planar film having adhesive on a lower surface thereof and directly secured to at least a portion of the top surface of the housing for covering at least some of the open ends of the passages therein to provide a smooth surface area for engagement by the vacuum-suction nozzle for manipulating and positioning the connector assembly.

4. The system of claim 3 wherein said solder tails are bent generally parallel to the bottom surface of the housing for soldering to circuit traces on a surface of the printed circuit board.

5. The system of claim 3 wherein said housing includes a plurality of sidewalls extending between said top surface and said bottom surface and defining an outer periphery of said top surface and said film is secured only within the outer periphery of said top surface.

6. A system for mounting a connector assembly to a mounting surface of an electrical apparatus through the use of a vacuum-suction nozzle, comprising:

a connector assembly adapted to be positioned adjacent said mounting surface, the connector assembly having a generally irregular top surface and a bottom surface adapted to be mounted adjacent to the mounting surface of the electrical apparatus, and a plurality of sidewalls extending between said top surface and said bottom surface and defining an outer periphery of said top surface, a plurality of electrical terminals mounted on a connector housing and including tail portions for interconnection to circuitry of the electrical apparatus, and a generally planar film secured directly to the top surface of the connector assembly to provide a smooth surface area for engagement by the vacuum-suction nozzle for manipulating and positioning the connector assembly, said film being secured only within the periphery of said top surface.

7. The system of claim 6 wherein said solder tails are bent generally parallel to the bottom surface of the housing for soldering to circuit traces on a surface of the printed circuit board.

* * * * *